United States Patent
Aparin

(10) Patent No.: US 6,531,924 B2
(45) Date of Patent: Mar. 11, 2003

(54) BIAS METHOD AND CIRCUIT FOR DISTORTION REDUCTION

(75) Inventor: Vladimir Aparin, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 10/002,377

(22) Filed: Nov. 15, 2001

(65) Prior Publication Data

US 2002/0175735 A1 Nov. 28, 2002

Related U.S. Application Data

(60) Provisional application No. 60/284,791, filed on Apr. 18, 2001.

(51) Int. Cl.[7] .................................................. H03F 3/04
(52) U.S. Cl. ...................... 330/296; 330/289; 327/530; 327/247
(58) Field of Search ................................ 330/289, 296; 327/530, 427

(56) References Cited

U.S. PATENT DOCUMENTS

| | | | | |
|---|---|---|---|---|
| 6,348,834 B1 | * | 2/2002 | Brown | 327/543 |
| 6,359,516 B1 | * | 3/2002 | Luo et al. | 330/296 |
| 2002/0075076 A1 | * | 6/2002 | Sowlati | 330/296 |
| 2002/0125954 A1 | * | 9/2002 | Luo et al. | 330/288 |

* cited by examiner

Primary Examiner—Terry D. Cunningham
Assistant Examiner—Quan Tra
(74) Attorney, Agent, or Firm—Philip R. Wadsworth; Charles D Brown; Howard H. Seo

(57) ABSTRACT

The present invention provides a technique for selective cancellation of the $2^{nd}$-order or $3^{rd}$-order nonlinearity of a transistor. Any nonlinearity is a function of the bias voltage of a transistor. In many cases, this function is such that, at a particular bias voltage, nonlinearity is zero. The invention provides a bias circuit that generates the optimum bias voltage for a transistor at which its selected nonlinearity is zero. Mathematically, the nonlinearity can be represented by a sum of multiple components where some components have negative sign. The components are proportional to the DC currents of the transistor at bias voltages differing by a small amount. The bias circuit includes bias transistors that are scaled versions of the main transistor. Each bias transistor generates a DC current representing one of the components. The currents are combined according to the signs of the respective components to form a DC signal proportional to the selected nonlinearity. A feedback circuit senses the DC signal and generates the bias voltages of the bias transistors that force the DC signal to be zero. One of the bias voltages is applied to the main transistor resulting in cancellation of its selected nonlinearity. The system may be readily implemented using the integrated circuit technology such that the transistors of the bias circuit are closely matched to each other and to the main transistor. The distortion cancellation effect provided by the present invention exhibits low sensitivity to variations in the transistor processing and operational temperature.

30 Claims, 5 Drawing Sheets

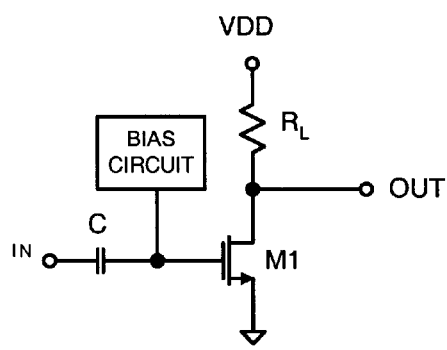
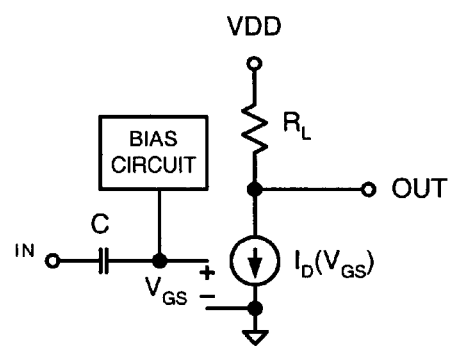
FIG. 1A
(Prior Art)
FIG. 1B
(Prior Art)
*FIG. 1*

BIAS METHOD AND CIRCUIT FOR DISTORTION REDUCTION

RELATED APPLICATIONS

This application claims priority from U.S. Provisional Application Ser. No. 60/284,791, filed Apr. 18, 2001, the content of which is incorporated herein by reference in its entirety.

FIELD OF THE INVENTION

The present invention is related generally to transistor circuits and, more particularly, to a bias method and circuit for distortion reduction.

BACKGROUND OF THE INVENTION

Transistor amplifiers and mixers are commonly used building blocks of analog circuits operating at frequencies ranging from audio to radio frequencies (RF). Generally, these circuits are required to minimally distort the signal they operate on to preserve the information carried by the signal.

The signal distortion in active circuits is generated by nonlinearities of the transistor. Consider a simple common-source NMOS amplifier and its equivalent circuit shown in FIGS. 1A and 1B, respectively. In FIG. 1A, M1 is an NMOS transistor, C is a direct current (DC) blocking capacitor, and $R_L$ is a drain bias resistor. The equivalent circuit of FIG. 1B is an ideal model of the circuit of FIG. 1A. In FIG. 1B, $V_{GS}$ is the gate-source voltage and $I_D$ is the drain current of M1. The drain current $I_D$ is a function of $V_{GS}$. For proper operation, the gate of the transistor M1 should be biased above the threshold voltage to allow a nonzero DC drain current to flow through M1. The gate A commonly used prior-art bias circuit is shown in FIG. 2 where a transistor M2 is a scaled version (replica) of the transistor M1 with the same gate length but a narrower width. Also shown in FIG. 2 is a reference current source, $I_{REF}$, and a bias resistor, $R_B$, that isolates the bias circuit from the amplifier input at the operating frequency of the amplifier. The drain of the transistor M1 is biased in the saturation region for high gain. Ideally, the transistor M1 operates as a linear voltage-controlled current source having the following characteristics:

$$I_D = g_m(V_{GS} - V_{TH}) \tag{1}$$

where $V_{TH}$ is the threshold voltage of the transistor M1 and $g_m$ is the bias-independent coefficient called transconductance in units amperes per volt (A/V).

For further analysis, it is convenient to separate the DC values of $I_D$ and $V_{GS}$ from their alternating current (AC) values using the following relations:

$$I_D = I_{D0} + i_D$$
$$V_{GS} = V_{GS0} + v_{GS}$$
$$I_{D0} = g_m(V_{GS0} - V_{TH}). \tag{2}$$

where $I_{D0}$ is the DC drain current and $V_{GS0}$ is the DC gate-source voltage of M1 generated by the bias circuit. In equation (2) $v_{GS}$ is the AC gate-source voltage equal to the input signal voltage ($v_{IN}$) and $i_D$ is the AC drain current. Equation (1) can be written in terms of the introduced AC values as follows:

$$i_D = g_m v_{GS} \tag{3}$$

Where all terms have been previously defined.

When the AC input signal $v_{IN}$ is applied to the circuit, the transistor M1 generates an output AC current equal to $g_m v_{IN}$ that creates a voltage drop across the drain-bias resistor $R_L$ equal to $-g_m v_{IN} R_L$. This voltage across the drain-bias resistor $R_L$ is the output signal of the amplifier and $-g_m R_L$ is its gain.

In the ideal amplifier illustrated in FIGS. 1A and 1B, the output signal is a scaled version of the input signal (i.e., there are no spurious responses of the system). The spectrum of the output signal has the same frequency components as the input signal.

Unfortunately, the transconductance of a real-life transistor is not a constant but a function of the input bias voltage. This function is often described by a sophisticated equation or a system of equations. To simplify circuit analysis, this function is replaced by its Taylor series expansion near $V_{GS0}$ as follows:

$$g_m = g_1 + g_2 v_{GS} + g_3 v_{GS}^2 + \tag{4a}$$

where $g_1$, $g_2$ and $g_3$ are the expansion coefficients equal to:

$$g_1(V_{GS}) = \frac{dI_D}{dV_{GS}} \tag{4b}$$

$$g_2(V_{GS}) = \frac{1}{2}\frac{d^2 I_D}{dV_{GS}^2} = \frac{1}{2}\frac{d}{dV_{GS}}\left(\frac{dI_D}{dV_{GS}}\right) = \frac{1}{2}\frac{dg_1(V_{GS})}{dV_{GS}}$$

$$g_3(V_{GS}) = \frac{1}{6}\frac{d^3 I_D}{dV_{GS}^3} = \frac{1}{3}\frac{dg_2(V_{GS})}{dV_{GS}}$$

Substituting this $g_m$ expansion into equation (3) above, we get the following expression for the output current of a real-life NMOS transistor:

$$i_D = g_1 v_{GS} + g_2 v_{GS}^2 + g_3 v_{GS}^3 + \tag{5}$$

This expansion is often called a power series. The first term in the series is called a linear term and represents the desired function of the transistor (e.g., the transistor M1). The second term is called the $2^{nd}$-order nonlinearity. The third term is called the $3^{rd}$-order nonlinearity, etc. The nonlinearities are not desirable since they generate spurious responses that interfere with the desired signal.

There are several well known techniques to reduce the circuit spurious responses relative to its desired fundamental response. These techniques are often referred to as the linearization techniques. The simplest and widely-used technique is based on the fact that the $2^{nd}$ and $3^{rd}$-order expansion coefficients of the FET output current, $g_2$ and $g_3$, decrease relative to the linear transconductance $g_1$ at gate-to-source voltages much larger than the threshold voltage. So, selecting large-enough $V_{GS0}$ results in much smaller spurious responses relative to the fundamental response of the circuit. Unfortunately, this technique increases the DC current consumption of the circuit which may not be acceptable for some applications (e.g., battery operated devices).

Another technique is based on the fact that, for many field-effect transistors, there are particular input bias voltages at which either the $2^{nd}$ or the $3^{rd}$-order expansion coefficient is zero. These bias voltages are typically close to the threshold voltage and, therefore, don't result in a large DC drain current. If a transistor is biased at such a voltage, theoretically it generates zero $2^{nd}$ or $3^{rd}$ order distortion. It is possible to calculate a bias voltage at which $g_2$ or $g_3$ is zero from the simulated or measured transfer characteristic of the transistor. The calculated bias voltage will only be optimum for either a typical transistor for which the model was extracted or the measured transistor-sample. It will also be optimum only at a specific temperature at which the transfer characteristic was simulated or measured. It possible to design a bias circuit that generates this calculated gate-to-source voltage at which $g_2$ or $g_3$ is zero using a resistive divider for example. However, it will not satisfactorily eliminate the corresponding distortion as the operating temperature changes or the parameters of the transistor manufacturing process drift.

Accordingly, it can be appreciated that there is a significant need for a bias circuit that eliminates undesirable distortion components independent of temperature fluctuations and manufacturing process drifts. The present invention provides this, and other advantages, as will be apparent from the following detailed description and the accompanying figures.

SUMMARY OF THE INVENTION

The present invention is embodied in a method and circuit for biasing a transistor. The transistor to be biased has a transfer characteristic that may be characterized by a linear or first-order term that describes a straight line and nonlinear or higher-order terms, such as $2^{nd}$-order and $3^{rd}$-order nonlinearities, that describe the deviations of the transfer characteristic from the straight line. The inventive method generates a direct current signal proportional to a selected nonlinearity of the transistor and uses the DC signal to generate the bias voltage of the transistor at which the selected nonlinearity is zero.

In one example, the selected nonlinearity is a $2^{nd}$-order nonlinearity and the DC signal comprises first, second and third portions. The first, second and third portions are combined to form the DC signal. In another example, the selected nonlinearity is a $3^{rd}$-order nonlinearity and the DC signal comprises first, second, third and fourth portions. The first, second, third and fourth portions are combined to form the DC signal.

The method may also include providing a mirror to bias circuit elements that generate the DC signal. A feedback circuit may also be provided to sense the DC signal and generate the bias voltage at which the DC signal and the selected nonlinearity are zero. The DC signal may be a current or a voltage, single-ended or differential.

The response of the transistor may be characterized by a power series having a linear term and nonlinear terms or nonlinearities. The nonlinearities each consist of multiple components. The bias circuit may comprise individual bias transistors designed to generate DC signal portions corresponding to the individual components of a selected nonlinearity. The DC signal portions are combined to form the DC signal proportional to the selected nonlinearity. A feedback circuit may be provided to sense the DC signal and generate the bias voltages of the bias transistors at which the DC signal and the selected nonlinearity are zero. For example, a $2^{nd}$-order nonlinearity may be characterized by first, second and third components. The bias circuit may comprise first, second and third bias transistors that produce DC signal portions corresponding to the first, second and third components. The DC signal portions are combined to generate the DC signal proportional to the $2^{nd}$-order nonlinearity. A feedback circuit senses the DC signal and generates the bias voltages of the bias transistors at which the DC signal is zero. One of these voltages is applied to the main transistor effectively canceling its $2^{nd}$-order nonlinearity.

BRIEF DESCRIPTION OF THE DRAWINGS

FIG. 1A is a conventional common-source transistor amplifier.

FIG. 1B is the equivalent circuit of the common-source amplifier of FIG. 1A.

DETAILED DESCRIPTION OF THE PREFERRED EMBODIMENTS

The present invention describes a method and bias circuit to selectively reduce the $2^{nd}$-order or $3^{rd}$-order nonlinearities of a transistor and the corresponding signal distortions. The techniques described herein operates satisfactorily in spite of process variations from one circuit to another and temperature fluctuations.

The principles of the present invention are based on the fact that, for many transistors, the $2^{nd}$-order and $3^{rd}$-order expansion coefficients of the output current (i.e., $g_2$ and $g_3$) depend on the input bias voltage. That is, the AC output current $i_D$ of Equation (5) is a power series comprising $2^{nd}$-order and $3^{rd}$-order nonlinearities characterized by the $2^{nd}$-order and $3^{rd}$-order expansion coefficients, $g_2$ and $g_3$, respectively. In turn, the value of the expansion coefficients $g_2$ and $g_3$ depend on the input bias voltage. This dependence is such that, at a particular input bias voltage, either $g_2$ or $g_3$ is zero. If the amplifier input is biased at this voltage, its $2^{nd}$ or $3^{rd}$-order nonlinearity will be cancelled and the signal will not exhibit the $2^{nd}$ or $3^{rd}$-order distortion.

Figure 3A:
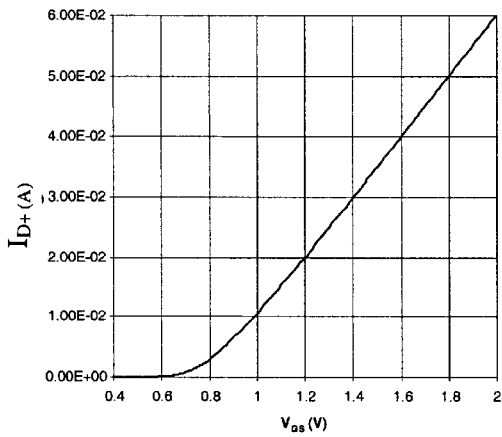
FIGS. 3A–3D are a series of graphs illustrating the transfer characteristic of a typical transistor and its power series expansion coefficients as functions of the input bias voltage.
Figure 3C:
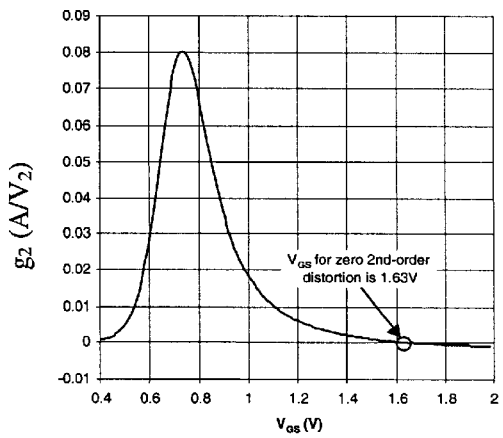
Figure 3B:
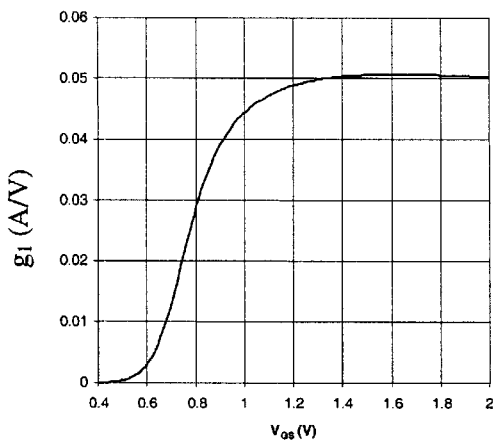
Figure 3D:
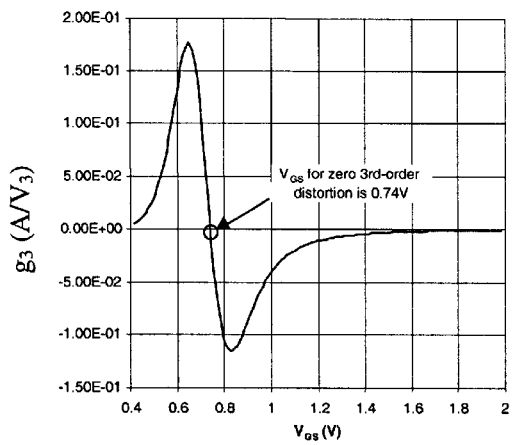

As an example, consider the transistor circuit of FIG. 1A and its equivalent circuit, illustrated in FIG. 1B. As previously noted, the drain current $I_D$ is a function of the gate-to-source voltage $V_{GS}$. The transfer characteristic of a short-channel NMOS transistor is illustrated in FIG. 3A where the drain current $I_D$ is plotted as a function of the gate-to-source voltage $V_{GS}$. FIGS. 3B–3D are graphs of the expansion coefficients $g_1$–$g_3$, derived from Equation (4b). FIG. 3B illustrates the linear transconductance of the transistor M1. FIG. 3C illustrates the coefficient of the $2^{nd}$-order nonlinearity. It should be noted that the expansion coefficient $g_2$ and the corresponding $2^{nd}$-order distortion are zero at $V_{GS}$=1.63V. FIG. 3D illustrates the coefficient of the $3^{rd}$-order nonlinearity of the transistor M1. It should be noted that the expansion coefficient $g_3$ and the corresponding $3^{rd}$-order distortion are zero at $V_{GS}$=0.74V.

Using techniques known in the prior art, it is possible to use a conventional resistive divider to bias the transistor M1 with a fixed DC voltage. For example FIG. 3D illustrates that a bias voltage of approximately 0.74 volts results in a value of 0 for the expansion coefficient $g_3$. However, it should be appreciated that the characteristic curves of FIGS. 3A–3D represent a single NMOS transistor at a specific temperature. Temperature fluctuations and drifts in the manufacturing process of the transistor cause these characteristics to shift relative to the $V_{GS}$ axis. The steep slope of the $g_3$ characteristic in FIG. 3D near the zero-crossing point illustrates that even minor shifts in this point will increase the $3^{rd}$-order distortion significantly if the bias voltage remains fixed at 0.74 volts. Accordingly, fixed DC bias voltage circuits known in the art are inadequate to achieve a stable reduction or elimination of the $2^{nd}$-order or $3^{rd}$-order distortion. It is challenging to design a bias circuit that automatically generates and maintains the optimum bias voltage that cancels a selected nonlinearity under fluctuating temperature and drifting process conditions. The present invention addresses this challenge.

Figure 2:
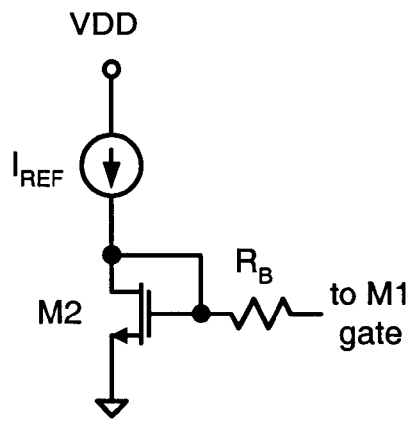
FIG. 2 is a conventional bias circuit used to bias the common-source transistor amplifier of FIG. 1A.

To generate and automatically maintain the optimum bias voltage resulting in zero $2^{nd}$ or $3^{rd}$-order distortion, a bias circuit should have a replica of the amplifying transistor such as the bias transistor M2 in FIG. 2 and the means to produce a measurable electrical quantity such as a DC voltage or current proportional to $g_2$ or $g_3$ of the replica-transistor. It should also have a DC feedback that senses this quantity and automatically adjusts the bias voltage of both the amplifying transistor and its replica for $g_2=0$ or $g_3=0$.

The insight into how to generate the DC voltage or current proportional to $g_2$ or $g_3$ can be gained if equations (4b) are rewritten in terms of small deviations of the voltages and currents rather than the derivatives.

$$g_1(V_{GS}) = \frac{I_{D(V_{GS}+\Delta V_{GS}/2)} - I_{D(V_{GS}-\Delta V_{GS}/2)}}{\Delta V_{GS}} \quad (6a)$$

$$g_2(V_{GS}) = \frac{1}{2} g_{1(V_{GS}+\Delta V_{GS}/2)} - \frac{g_{1(V_{GS}-\Delta V_{GS}/2)}}{\Delta V_{GS}} \quad (6b)$$

$$= \frac{1}{2\Delta V_{GS}} \left[ \frac{I_{D(V_{GS}+\Delta V_{GS})} - I_{D(V_{GS})}}{\Delta V_{GS}} - \frac{I_{D(V_{GS})} - I_{D(V_{GS}-\Delta V_{GS})}}{\Delta V_{GS}} \right]$$

$$= \frac{1}{2\Delta V_{GS}^2} \{ I_{D(V_{GS}+\Delta V_{GS})} + I_{D(V_{GS}-\Delta V_{GS})} - 2I_{D(V_{GS})} \}$$

$$g_3(V_{GS}) = \frac{1}{3} g_{2(V_{GS}+\Delta V_{GS}/2)} - \frac{g_{2(V_{GS}-\Delta V_{GS}/2)}}{\Delta V_{GS}} \quad (6c)$$

$$= \frac{1}{3\Delta V_{GS}} \left[ \frac{I_{D(V_{GS}+3\Delta V_{GS}/2)} - 2I_{D(V_{GS}+\Delta V_{GS}/2)} + I_{D(V_{GS}-\Delta V_{GS}/2)}}{2\Delta V_{GS}^2} - \frac{I_{D(V_{GS}+\Delta V_{GS}/2)} - 2I_{D(V_{GS}-\Delta V_{GS}/2)} + I_{D(V_{GS}-3\Delta V_{GS}/2)}}{2\Delta V_{GS}^2} \right]$$

$$= \frac{1}{6\Delta V_{GS}^3} \left\{ \begin{array}{l} [I_{D(V_{GS}+3\Delta V_{GS}/2)} + 3I_{D(V_{GS}-\Delta V_{GS}/2)}] \\ -[3I_{D(V_{GS}+\Delta V_{GS}/2)} + I_{D(V_{GS}-3\Delta V_{GS}/2)}] \end{array} \right\}$$

Figure 4:
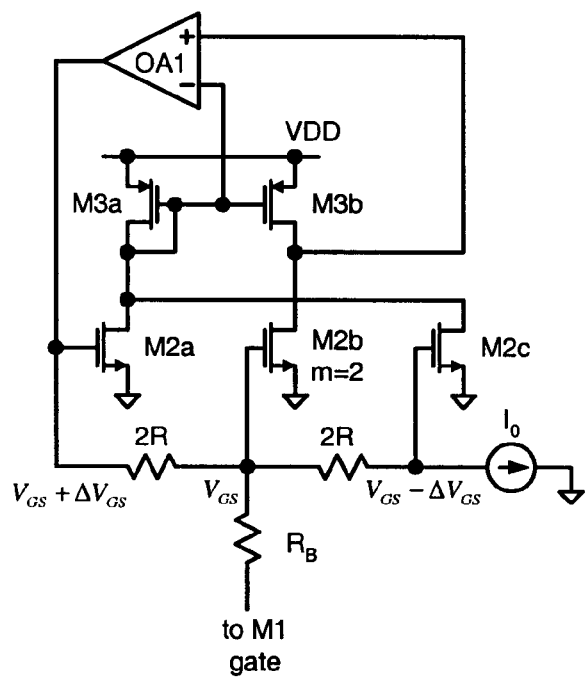
FIG. 4 is an exemplary embodiment of a bias circuit of the present invention designed to generate the input bias voltage at which the $2^{nd}$-order nonlinearity is zero.

It should be noted that terms within the parentheses in equations (6a–6c) indicate operating parameters. For example, the term $I_{D(V_{GS}+\Delta V_{GS})}$ in equation (6b) is intended to indicate the current $I_D$ at the voltage $V_{GS}+\Delta V_{GS}$. Similarly, the term $I_{D(V_{GS}+3\Delta V_{GS}/2)}$ in equation (6c) indicates the current $I_D$ at a voltage $V_{GS}+3\Delta V_{GS}/2$. The term $\Delta V_{GS}$ is a small deviation from $V_{GS}$. The terms in the braces of equations (6b) and (6c) are measurable quantities that should be set to zero for $g_2=0$ or $g_3=0$ to cancel the $2^{nd}$-order or $3^{rd}$-order distortion, respectively. FIG. 4 illustrates one example of bias circuit that generates the term in the braces of (6b) and automatically adjusts $V_{GS}$ to set this term to zero.

Transistors M2a, M2b and M2c are replicas of the transistor M1 in FIG. 1 having the same gate length as M1, but their width is scaled down. The gates of the three replicas are biased through a resistor chain 2R,2R with a current sink $I_0$. The resistor unit value R and the current value $I_0$ are chosen such that the voltage drop $I_0R$ is equal to $\Delta V_{GS}/2$ in equations (6a)–(6c). The value of each resistor in FIG. 4 is selected 2R so that the voltage drops are conveniently measured in terms of $\Delta V_{GS}$.

The circuit of FIG. 4 operates satisfactorily so long as the value for $\Delta V_{GS}$ is much smaller than the value for $V_{GS}$ to make sure that $V_{GS}+\Delta V_{GS}$ and $V_{GS}-\Delta V_{GS}$ are close to $V_{GS}$. For example, if $I_0$ were selected to have a value of 0.05 milliamps (mA) and 2R were selected at 400 Ω, the value of $\Delta V_{GS}=20$ millivolts. The actual value for $\Delta V_{GS}$ is a design choice within the scope of the knowledge of the circuit designer using the principles described herein. Accordingly, the present invention is not limited by the specific current value $I_0$, the resistor unit value R or the selected value for $\Delta V_{GS}$.

All three bias transistors (M2a, M2b and M2c) have the same W/L ratio. The transistors M2a and M2c are single transistor devices, while the transistor M2b consists of two parallel devices, each of which is the same size as the transistors M2a and M2c. This is indicated in the circuit of FIG. 4 by the designation m=2 associated with the transistor M2b where m is the multiplicity factor.

The transistor M2a generates the current represented by the first summand shown in the braces of equation (6b). That is, the transistor M2a generates a current having the value equal to $I_{D(V_{GS}+\Delta V_{GS})}$. In contrast, the transistor M2c generates the current represented by the second summand shown in the braces of Equation (6b). That is, the transistor M2c generates a current having the value equal to $I_{D(V_{GS}-\Delta V_{GS})}$. Finally, the transistor M2b generates the current represented by the third summand shown in the braces of the Equation (6b). That is, the transistor M2b generates a current equal to $2I_{D(VGS)}$.

The currents of the transistors M2a and M2c are added by connecting their drains together. The common drain of the transistors M2a and M2c and the drain of M2b are biased through a current mirror comprising a pair of transistors M3a and M3b where M3a and M3b are PMOS transistors of an equal size. The differential DC voltage between the drains of the transistors M3a and M3b is the DC signal proportional to the mathematical term in the braces of the Equation (6b) and, thus, to the $2^{nd}$-order expansion coefficient $g_2$. If the differential voltage is zero, the combined current of the transistors M2a and M2c is equal to the current of the transistor M2b, and the term in the braces of the Equation (6b) is zero. The transistor M3b is a current mirror that produces the same current as the transistor M3a provided that its drain voltage is the same as that of M3a.

This balance of the currents is ensured by an operational amplifier OA1 in FIG. 4 that senses the differential DC voltage between the drains of the transistors M3a and M3b and generates the input voltage for the resistor chain 2R, 2R thus creating a feedback loop. The function of the operational amplifier OA1 is readily understood by a circuit designer following the example circuit of FIG. 4. Briefly, the operational amplifier OA1 amplifies the differential input voltage with a high gain and feeds the amplified voltage to the gates of the transistors M2a, M2b and M2c with a polarity such that the operating point of these transistors is adjusted until their drain voltages are equal.

The gate and drain of the transistor M3a are coupled together. The positive input of the operational amplifier OA1 is coupled to the junction of the drains of the transistors M3b and M2b. If, by way of example, the drain voltage of the transistor M3b increases, the output of the operational amplifier OA1 provides an increased signal directly to the gate of the transistor M2a and to the gates of the transistors M2b and M2c via the resistor network 2R, 2R. The increased gate voltage of the transistor M2b causes a decrease in its drain voltage thus bringing the drain voltage of the transistor M3b into equilibrium with its gate voltage which is also the voltage on the gate and drain of the transistor M3a. Therefore, the drain currents of the transistors M3a and M3b are maintained equal.

Thus, the voltage $V_{GS}$ in FIG. 4 is the desired bias voltage that will eliminate the contribution of the $2^{nd}$-order nonlinearity (i.e., $g_2=0$). The bias voltage is provided to the gate of the transistor M1 (see FIG. 1a) through a transistor $R_b$, which serves to isolate the bias circuit from the transistor M1 at the operating frequency. In an exemplary embodiment, the isolation transistor $R_b$ may have a value of approximately 10 kΩ. The feedback loop in FIG. 4 automatically maintains $V_{GS}$ supplied to the gate of M1 in FIG. 1a at the level that causes its $2^{nd}$-order nonlinearity to be zero even in the presence of process and temperature variations.

Figure 5:
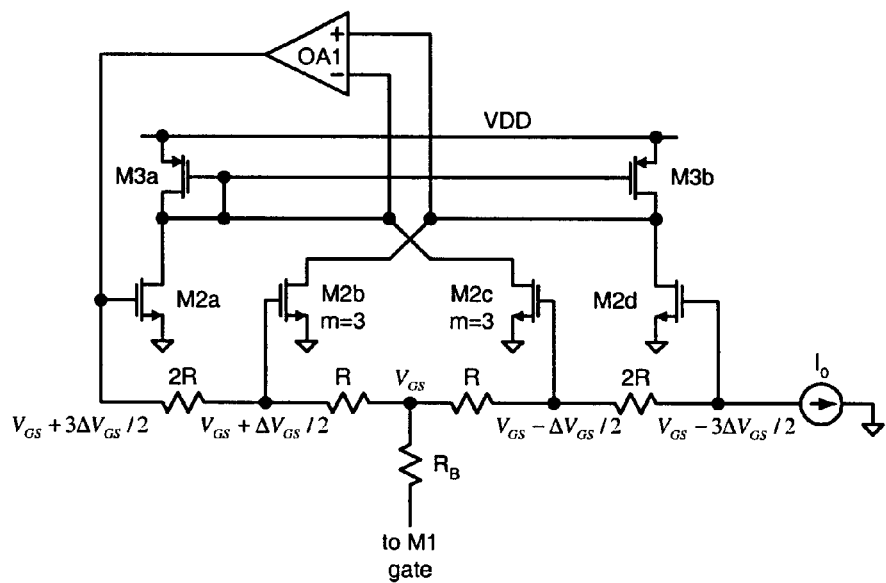
FIG. 5 is an alternative embodiment of a bias circuit of the present invention designed to generate the input bias voltage at which the $3^{rd}$-order nonlinearity is zero.

The circuit of FIG. 4 selectively generates currents proportional to the components of the $2^{nd}$-order nonlinearity that are used to generate the bias voltage to effectively cancel out the $2^{nd}$-order nonlinearity. A similar approach may be used to cancel out the $3^{rd}$-order nonlinearity. FIG. 5 illustrates an exemplary embodiment of a circuit that effectively cancels out the mathematical term in the braces of equation (6c) thus setting the value of the expansion coefficient $g_3$ equal to zero.

Although the circuit of FIG. 5 operates in a similar fashion to that of FIG. 4, some additional explanation may assist in a further understanding of the operation. An analysis of equation (6c) indicates that there are four summands contained within the braces. Each of the transistors M2a, M2b, M2c and M2d in FIG. 5 generates a DC current represented by a respective summand in the braces of equation (6c). The transistors M2a, M2b, M2c and M2d are replicas of the transistor M1 in FIG. 1 having the same gate length as M1, but their width is scaled down. The gates of the four replicas are biased through the resistor chain 2R,R,R,2R with the current sink $I_0$.

The voltage drop produced by passing the current $I_0$ through the resistance R is equivalent to $\Delta V_{GS}/2$ in equations (6a)–(6c). This voltage drop is chosen relatively small so that $V_{GS}+3\Delta V_{GS}/2$ and $V_{GS}-3\Delta V_{GS}/2$ are close to $V_{GS}$. As previously discussed, the only requirement is that $\Delta V_{GS}$ be much smaller than $V_{GS}$. Similarly, the values for the resistors R and 2R may be selected as a matter of engineering choice to have convenient resistor values. The value of the current sink $I_0$ is also chosen as a matter of design choice based on the description provided herein. For example, if the circuit of the present invention is intended for use in a battery operated circuit, it is desirable to minimize the current draw in the current sink $I_0$ and power consumption within the resistors R and 2R for the selected $\Delta V_{GS}$. In contrast, a circuit having an external power supply has no such limitations. Accordingly, the present invention is not limited by the specific values selected for the resistors R and 2R or the value of the current through the current sink $I_0$.

All four transistors have the same W/L ratio. However, the transistors M2a and M2d are single transistor devices while the transistors M2b and M2c each consist of three parallel devices of the same size as the transistors M2a and M2d. This is indicated in the circuit of FIG. 5 by the designation m=3 associated with the transistors M2b and M2c.

The transistor M2a generates the current represented by the first summand shown in the braces of equation (6c). That is, the transistor M2a generates a current equal to $I_{D(V_{gs}+3\Delta V_{gs}/2)}$. The transistor M2b generates the third current shown in the braces of equation (6c). That is, the transistor M2b generates the current equal to $3I_{D(V_{gs}+\Delta V_{gs}/2)}$. The transistor M2c generates the second current shown in the braces of equation (6c). That is, the transistor M2c generates a current equal to $3I_{D(V_{gs}-\Delta V_{gs}/2)}$. Finally, the transistor M2d generates the fourth current shown in the braces of equation (6c). That is, the transistor M2d generates current equal to $I_{D(V_{gs}-3\Delta V_{gs}/2)}$.

The currents of the transistors M2a and M2c are added by connecting their drains together. The currents of the transistors M2b and M2d are added in the same way.

The common drains of the transistors M2a,M2c and the transistors M2b,M2d are biased through a current mirror comprising transistors M3a and M3b where the transistors M3a and M3b are PMOS transistors of an equal size. The differential DC voltage between the drains of M3a and M3b is the DC signal proportional to the mathematical term in the braces of the Equation (6c) and, thus, to the $3^{rd}$-order expansion coefficient $g_3$. If the differential voltage is zero, the added currents through the transistors M2a,M2c and M2b,M2d are equal, and the term in the braces of equation (6c) is zero.

This balance of the currents is ensured by the operational amplifier OA1 in FIG. 5, which operates in a manner similar to that of the operational amplifier OA1 in FIG. 4. Specifically, the operational amplifier OA1 in FIG. 5 senses the differential DC voltage between the drains of the transistors M3a and M3b and generates the input voltage for the resistor chain 2R,R,R,2R creating a feedback loop. This feedback loop automatically maintains $V_{GS}$ supplied to the gate of M1 in FIG. 1a at the level that causes its $3^{rd}$-order nonlinearity to be zero even in the presence of process and temperature variations.

Thus, the present invention permits a simple approach that achieves a significant reduction in either the $2^{nd}$-order or $3^{rd}$-order nonlinearity and exhibits low sensitivity to variations in the processes used to manufacture transistors and temperature variations. Although the exemplary bias circuits of FIG. 4 and FIG. 5 do add additional circuitry, the DC current increase required to operate the bias circuits of the present invention is negligible. This is a significant advantage in battery operated applications. Furthermore, the bias circuits of the present invention do not degrade other circuit performance, such as the noise figure of the transistor M1 (see FIG. 1A). Furthermore, the DC bias circuits of the present invention may be used for transistors (e.g., the transistor M1 of FIG. 1A) operating at virtually any frequency.

The described bias circuits are possible embodiments of the invention. There are other bias circuit topologies that can generate the optimum bias voltages based on zeroing a DC voltage or current proportional to the $2^{nd}$ or $3^{rd}$-order expansion coefficient. The invention can be used in MOSFET, MESFET, HEMT, BJT and HBT gain stages operating at any frequency.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A method of biasing a transistor by providing a biasing circuit, characterized by:

generating a direct current (DC) signal proportional to a selected nonlinearity; and using the DC signal to generate the bias voltage of the transistor at which the selected nonlinearity is zero.

2. The method of claim 1 wherein the selected nonlinearity is a second order nonlinearity and the DC signal comprises first, second and third portions.

3. The method of claim 2 wherein the first, second and third portions are combined to form the DC signal.

4. The method of claim 1 wherein the selected nonlinearity is a third order nonlinearity and the DC signal comprises first, second, third and fourth portions.

5. The method of claim 4 wherein the first, second, third and fourth portions are combined to form the DC signal.

6. The method of claim 1, further comprising providing a current mirror to bias circuit elements that generate the DC signal.

7. The method of claim 1, further comprising providing a feedback circuit to sense the DC signal and generate the bias voltage at which the DC signal and the selected nonlinearity are zero.

8. The method of claim 1 wherein the DC signal is a single-ended or differential current.

9. The method of claim 1 wherein the DC signal is a single-ended or differential voltage.

10. A transistor biasing circuit, characterized by:

a plurality of bias transistors each generating a DC current that is a portion of a DC signal proportional to a selected nonlinearity;

a combining circuit that combines the DC currents to form the DC signal; and a feedback circuit to sense the DC signal and generate an input bias voltage of the bias transistors that cancels the selected nonlinearity.

11. The circuit of claim 10 wherein the selected nonlinearity is a second order nonlinearity characterized by first, second and third components, the plurality of bias transistors comprises first, second and third bias transistors generating DC signal portions proportional to the first, second and third components, respectively.

12. The circuit of claim 11 wherein the combining circuit combines the first, second and third DC signal portions to form the DC signal.

13. The circuit of claim 12 wherein the feedback circuit is configured for sensing the DC signal and generating the input bias voltage of the bias transistors that cancels the second order nonlinearity.

14. The circuit of claim 10 wherein the selected component is a third order nonlinearity characterized by first, second, third and fourth components, the plurality of bias transistors comprises first, second, third and fourth bias transistors generating DC signal portions proportional to the first, second, third and fourth components, respectively.

15. The circuit of claim 14 wherein the combining circuit combines the first, second, third and fourth DC signal portions to form the DC signal.

16. The circuit of claim 15 wherein the feedback circuit is configured for sensing the DC signal and generating the input bias voltage of the bias transistors that cancels the third order nonlinearity.

17. The circuit of claim 10 wherein the combining circuit includes a current mirror coupled to the plurality of bias transistors to bias the plurality of bias transistors.

18. The circuit of claim 10 wherein the feedback circuit includes an operational amplifier for sensing and amplifying the DC signal.

19. The circuit of any claim 10 wherein the feedback circuit includes a resistor chain for generating individual bias voltages of the bias transistors to ensure their generation of the DC signal portions.

20. The circuit of claim 10 wherein the DC signal is a single-ended or differential current.

21. The circuit of claim 10 wherein the DC signal is a single-ended or differential voltage.

22. A transistor biasing circuit for minimizing a signal distortion of a transistor, comprising:

means for generating a direct current (DC) signal proportional to a selected nonlinearity; and means for applying the DC signal to generate the bias voltage of the transistor at which the selected nonlinearity is zero.

23. The circuit of claim 22 wherein the selected nonlinearity is a second order nonlinearity and the means for generating the DC signal generates first, second and third portions.

24. The circuit of claim 23 wherein the first, second and third portions are combined to form the DC signal.

25. The circuit of claim 22 wherein the selected nonlinearity is a third order nonlinearity and the means for generating the DC signal generates first, second, third and fourth portions.

26. The circuit of claim 25 wherein the first, second, third and fourth portions are combined to form the DC signal.

27. The circuit of any of claim 22, further comprising means for providing a current mirror to bias the means for generating the DC signal.

28. The circuit claim 22, further comprising providing feedback means for sensing the DC signal and for generating the bias voltage at which the DC signal and the selected nonlinearity are zero.

29. The circuit claim 22 wherein the DC signal is a single-ended or differential current.

30. The circuit claim 22 wherein the DC signal is a single-ended or differential voltage.

* * * * *